United States Patent
Raorane et al.

(10) Patent No.: US 10,403,578 B2
(45) Date of Patent: Sep. 3, 2019

(54) ELECTRONIC DEVICE PACKAGE

(71) Applicant: Intel Corporation, Santa Clara, CA (US)

(72) Inventors: Digvijay A. Raorane, Chandler, AZ (US); Vipul V. Mehta, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 10 days.

(21) Appl. No.: 15/721,788

(22) Filed: Sep. 30, 2017

(65) Prior Publication Data

US 2019/0103361 A1    Apr. 4, 2019

(51) Int. Cl.
| | |
|---|---|
| *H01L 23/12* | (2006.01) |
| *H01L 23/053* | (2006.01) |
| *H01L 23/538* | (2006.01) |
| *H01L 23/498* | (2006.01) |
| *H01L 23/00* | (2006.01) |
| *H01L 21/56* | (2006.01) |
| *H01L 23/31* | (2006.01) |

(52) U.S. Cl.
CPC ........ *H01L 23/5389* (2013.01); *H01L 21/563* (2013.01); *H01L 23/12* (2013.01); *H01L 23/3114* (2013.01); *H01L 23/498* (2013.01); *H01L 23/5381* (2013.01); *H01L 24/19* (2013.01); *H01L 24/73* (2013.01)

(58) Field of Classification Search
None
See application file for complete search history.

(56) References Cited

U.S. PATENT DOCUMENTS

| | | | | |
|---|---|---|---|---|
| 2014/0001644 A1* | 1/2014 | Yu | ............ | H01L 21/56 257/774 |
| 2015/0371916 A1* | 12/2015 | Barr | ............ | H01L 23/295 438/127 |
| 2016/0315028 A1* | 10/2016 | Chou | ............ | H01L 23/3157 |
| 2017/0213809 A1* | 7/2017 | Lu | ............ | H01L 25/0655 |

* cited by examiner

*Primary Examiner* — Calvin Y Choi
(74) *Attorney, Agent, or Firm* — Thorpe North & Western, LLP; David W. Osborne

(57) ABSTRACT

Electronic device package technology is disclosed. In one example, an electronic device package can include a substrate having a top surface and a vertical surface extending downward from the top surface. The top surface and the vertical surface can define an edge. The electronic device package can also include an electronic component disposed on the top surface of the substrate and electrically coupled to the substrate. In addition, the electronic device package can include an underfill material disposed at least partially between the electronic component and the top surface of the substrate. A lateral portion of the underfill material can extend from the electronic component to at least the edge. Associated systems and methods are also disclosed.

24 Claims, 8 Drawing Sheets

ELECTRONIC DEVICE PACKAGE

TECHNICAL FIELD

Embodiments described herein relate generally to electronic device packages, and more particularly to controlling the flow of an underfill material over the surface of an electronic device package substrate.

BACKGROUND

Electronic devices, which include a chip component joined to a substrate, are often vulnerable to crack formation. In particular, cracks tend to appear along the bond lines around attachment structures such as bumps, including either between the bump and the component or between the bump and the substrate. Cracks may occur in manufacturing or use when the materials of the substrate and/or electronic device are subjected to thermal cycling and expand and contract at different rates. Such cracks are a major source of device failure in chip components. For instance, cracks in a substrate can damage dielectric layers inside the substrate. In addition, mechanical stress due to coefficient of thermal expansion (CTE) mismatch can cause delamination in multiple device stack layers on a die. Underfill techniques and materials are extensively used in semiconductor manufacturing in an effort to stabilize chip components and help prevent device failure.

One common underfill technique is "capillary underfill". Capillary underfill typically involves flowing an adhesive material between the component and the substrate, so that it contacts both the component and the substrate as it is drawn into and through an intervening gap by a wicking action. When functioning properly, the underfill will migrate completely beneath the component, displacing all air and reaching to all the edges of the chip component. The underfill may then be cured to form a substantially rigid material surrounding and strengthening each attachment joint. This can allow the materials to better withstand the stresses applied to attachment structure bond lines during thermal variation, and protect against delamination in multiple device stack layers on a die. At each edge of the component, a generally concave fillet of underfill material may form, extending from the component to the substrate surface only a short distance beyond the peripheral boundary of the component.

After it is dispensed, the flowable adhesive may flow not only into and through the gap between the component and the substrate, but also away from the dispense point and the component, across the surface of the substrate. Once cured, this "counter-directional" flow forms an "extended fillet" of underfill material. This generally unimpeded flow away from the component necessitates, in many instances, the use of more underfill than is necessary to simply fill the component-substrate gap, and the underfill material comprising the extended fillet is essentially wasted. Further, the area covered by the extended fillet is generally designated a "keep out zone" (KOZ) into which no other components are placed to avoid potentially damaging them. Therefore, on the side of a chip component where an extended fillet of underfill material forms, the substrate surface area beneath the extended fillet is effectively made unavailable for component placement and essentially wasted.

BRIEF DESCRIPTION OF THE DRAWINGS

Technology features and advantages will be apparent from the detailed description which follows, taken in conjunction with the accompanying drawings, which together illustrate, by way of example, various technology embodiments; and, wherein.

Figure 1A:
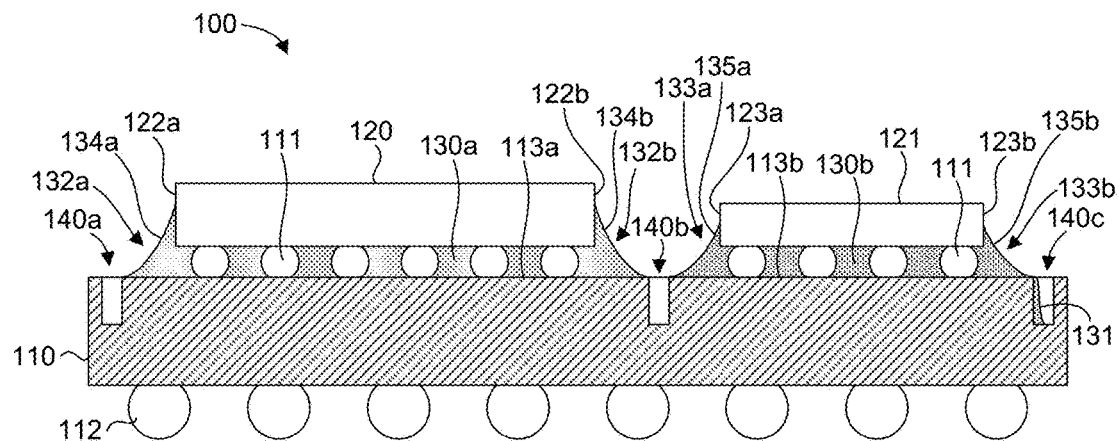
FIG. 1A illustrates a schematic representation of a side cross-sectional view of an electronic device package in accordance with an example embodiment.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before technology embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used to describe particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" include plural referents unless the context clearly dictates otherwise. Thus, for example, reference to "a layer" includes a plurality of such layers.

As used herein, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of"

have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the specification, like "comprising" or "including," it is understood that direct support should be afforded also to "consisting essentially of" language as well as "consisting of" language as if stated explicitly and vice versa.

The terms "first," "second," "third," "fourth," and the like as used herein, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like as used herein, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" objects, elements or structures are in physical contact with one another. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases, depend on the specific context. However, generally speaking, the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. It is understood that support in this specification for numerical values used in connection with the term "about" is also provided for the exact numerical value itself as though "about" were not used.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this written description to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this written description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

For the reasons mentioned above, it is desirable to minimize the underfill KOZ. The benefits of minimizing or eliminating the underfill KOZ include the ability to reduce package size and increase the package layout density. These advantages and others can significantly reduce package cost.

Accordingly, electronic device packages are disclosed in which a "sharp" edge formed in the top surface of a substrate serves to confine the flow and spread of liquid underfill material to control underfill KOZ. In one embodiment, this is accomplished at the wafer level by forming trenches in a wafer prior to singulation, thus facilitating high volume manufacturing. As a result, an electronic device package can include a substrate having a top surface and a vertical surface extending downward from the top surface. The top surface and the vertical surface can define an edge. The electronic device package can also include an electronic component disposed on the top surface of the substrate and electrically coupled to the substrate. In addition, the electronic device package can include an underfill material disposed at least partially between the electronic component and the top surface of the substrate. A lateral portion of the underfill material can extend from the electronic component to at least the edge. Associated systems and methods are also disclosed.

Figure 1B:
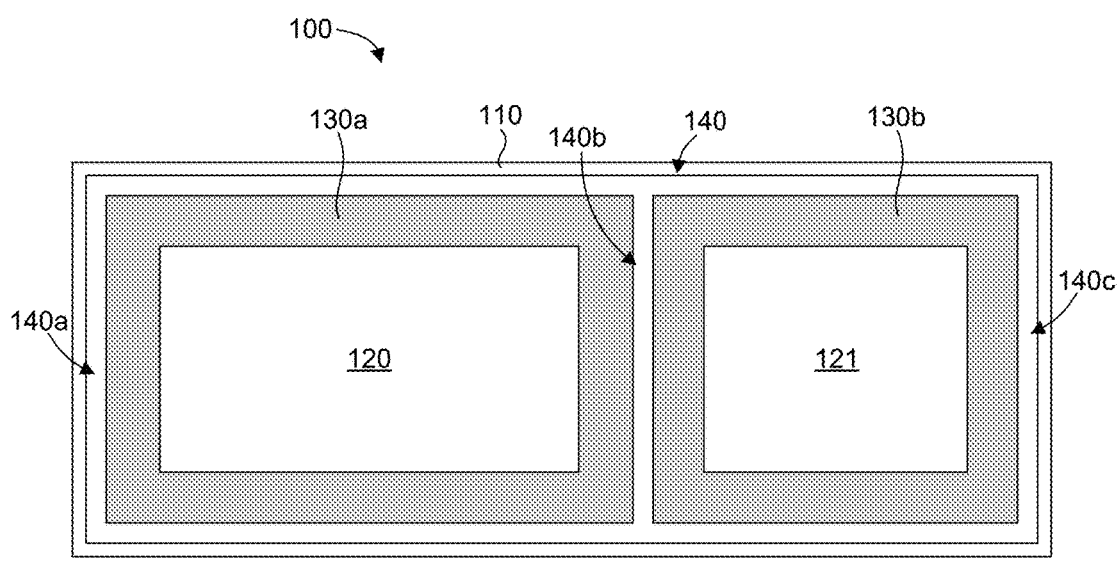
FIG. 1B illustrates a schematic representation of a top view of the electronic device package of FIG. 1A.

Referring to FIGS. 1A and 1B, an exemplary electronic device package 100 is illustrated. In general, the electronic device package 100 can include a substrate 110 and one or more electronic components 120, 121 disposed or mounted on the substrate 110. The electronic device package 100 can also include underfill material 130a, 130b disposed between the respective electronic components 120, 121 and the substrate 110.

An electronic component can be any electronic device or component that may be included in an electronic device package, such as a semiconductor device (e.g., a die, a chip, a processor, computer memory, a platform controller hub, etc.). In one embodiment, each of the electronic components 120, 121 may represent a discrete chip. The electronic components 120, 121 may be, include, or be a part of a processor (e.g., a CPU, a GPU, etc.), a memory device (e.g., SRAM, DRAM, flash memory, EEPROM, etc.), an application specific integrated circuit (ASIC), a platform controller hub (PCH), a field programmable gate array (FPGA), a modem, a system on a chip (SOC), a system in a package (SIP), or a package on a package (POP) in some embodiments. Although two electronic components 120, 121 are depicted in FIGS. 1A and 1B, any suitable number of electronic components can be included, such as only a single electronic component or more than two electronic components.

The substrate 110 is represented generally and may be of any suitable construction or material. For example, the substrate 110 may include typical substrate materials. In some embodiments, the substrate 110 can be constructed primarily of silicon (e.g., configured as an interposer). In some embodiments, the substrate 110 may be configured as an epoxy-based laminate substrate having a core and/or build-up layers. The substrate 110 may be configured as other suitable types of substrates in other embodiments. For example, the substrate can be formed primarily of any suitable semiconductor material (e.g., a silicon, gallium, indium, germanium, or variations or combinations thereof, among other substrates), one or more insulating layers, such as glass-reinforced epoxy, such as FR-4, polytetrafluoroethylene (Teflon), cotton-paper reinforced epoxy (CEM-3), phenolic-glass (G3), paper-phenolic (FR-1 or FR-2), polyester-glass (CEM-5), AJINOMOTO BUILD-UP FILM® (ABF), any other dielectric material, such as glass, or any combination thereof, ground layer, signal layer (e.g. copper film), and solder resist layer, such as can be used in printed circuit boards (PCBs).

The electronic components 120, 121 can be attached to the substrate 110 according to a variety of suitable configurations including a flip-chip configuration, wire bonding, and the like. The electronic components 120, 121 can be electrically coupled to the substrate 110 using interconnect structures (e.g., solder balls or bumps 111 and/or wire bonds) configured to route electrical signals between the electronic components 120, 121 and the substrate 110. In some embodiments, the interconnect structures may be configured to route electrical signals such as, for example, I/O signals and/or power or ground signals associated with the operation of the electronic components 120, 121.

The substrate 110 may include electrically conductive elements or electrical routing features (not shown) configured to route electrical signals to or from the electronic components 120, 121. The electrical routing features may be internal (e.g., disposed at least partially within a thickness of the substrate 110) and/or external to the substrate 110. For example, in some embodiments, the substrate 110 may include electrical routing features such as pads, vias, and/or traces configured to receive the interconnect structures and route electrical signals to or from the electronic components 120, 121. The pads, vias, and traces can be constructed of the same or similar electrically conductive materials, or of different electrically conductive materials. Any suitable electrically conductive material can be utilized, such as copper, gold, etc. The electronic device package 100 can also include interconnects 112, such as solder balls, for coupling with a next level component (e.g., a substrate or circuit board such as a motherboard) for power and/or signaling. The substrate 110 can also include a solder resist material or other surface treatment forming an outer layer of the substrate.

The underfill material 130a, 130b can be disposed at least partially between the respective electronic components 120, 121 and the substrate 110. The underfill material 130a, 130b is typically a polymer (e.g., an epoxy) typically applied between the electronic component 120 and the substrate 110 as an underfill encapsulant. The underfill material 130a, 130b surrounds the solder bumps 111 and acts to protect the bumps and connection between the electronic components 120, 121 and the substrate 110, as well as support the electronic components 120, 121 on the substrate 110.

In the embodiment shown in FIGS. 1A and 1B, the substrate 110 can include one or more trenches 140 (including, e.g., trench portions 140a-c), which can serve as and define one or more underfill confinement boundaries (e.g., an underfill KOZ), such as by extending about perimeters of the electronic components 121, 122. In one aspect, the trench 140 can subdivide the top of the substrate 110 into top surfaces 113a, 113b, on which the respective electronic components 120, 121 can be disposed or mounted. The trench 140 can form a channel, slot, recess, or other suitable opening in the substrate 110 that extends downward relative to the top (e.g., the top surfaces 113a, 113b) of the substrate 110. The trench 140 can extend through any substrate material or feature (e.g., silicon), or the trench 140 can be configured to avoid or be routed around a substrate material or feature (e.g., a surface or internal trace or other conductive feature).

Figure 2:
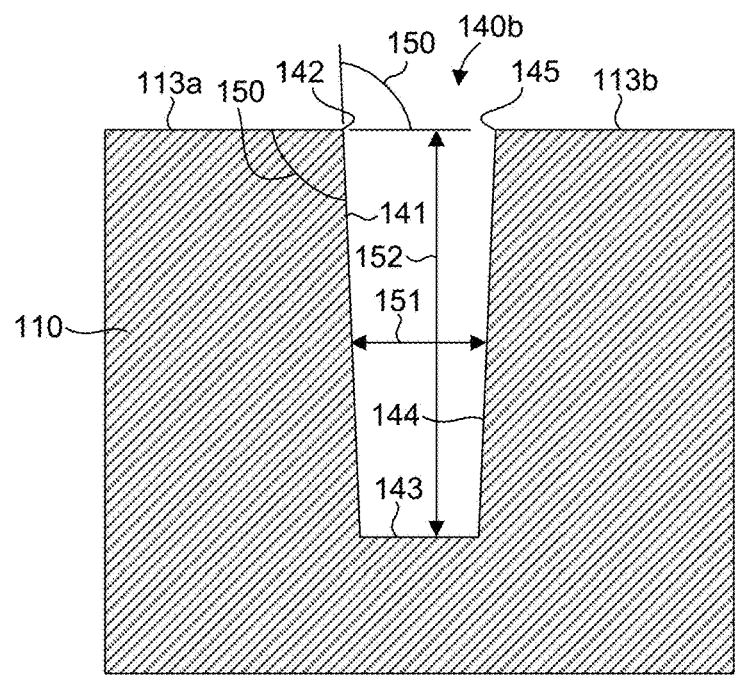
FIG. 2 illustrates a detailed side cross-sectional view of a substrate showing aspects of trench geometry.

With continued reference to FIGS. 1A and 1B, geometric aspects of the trench 140 are shown in FIG. 2, which are provided in the context of the trench portion 140b, but can be representative of any part of a trench. Other features or components, such as underfill material, have been omitted for clarity. A vertical surface 141 can extend downward from the top surface 113a of the substrate 110 and can form a sidewall of the trench portion 140b. The vertical surface 141 can be formed of any substrate material (e.g., silicon). The top surface 113a and the vertical surface 141 can define an edge 142 of the trench portion 140b. A horizontal surface 143 can extend from the vertical surface 141 and can form a bottom of the trench portion 140b. In some embodiments, the horizontal surface 143 can be formed of a conductive structure (e.g., a ground plane) in the substrate 110. Another vertical surface 144 can extend from the horizontal surface 143. The vertical surface 144 can extend upward from the horizontal surface 143 to the top surface 113b of the substrate 110, and can form another sidewall of the trench portion 140b. The vertical surface 144 can be formed of any substrate material (e.g., silicon). The top surface 113b and the vertical surface 144 can define another edge 145 of the trench portion 140b. Thus, the vertical surfaces 141, 144 and the horizontal surface 143 can define, at least in part, the trench portion 140b in the substrate 110. It should be understood that the terms "vertical" and "horizontal" as used herein in the context of describing various surfaces are meant as relative terms and not to imply a strict vertical or horizontal orientation of the surfaces or a strictly orthogonal relationship between vertical and horizontal surfaces.

The trench 140 can define and serve as an underfill confinement boundary (e.g., a KOZ) in at least two ways. First, the edges 142, 145 of the trench can serve as a barrier to flowing underfill material by virtue of the "sharp" edge geometry, which can confine the liquid meniscus of flowing underfill material. The physics of such liquid confinement involves the surface energy of the liquid underfill material, which is manifest by the contact angle of the liquid with the substrate 110. The mechanism underlying confinement of liquid underfill material is the pinning of the contact line and the associated extension of the contact angle hysteresis along the pinned perimeter of the underfill material. In other words, the edge angle of the liquid needs to increase up to the advancing contact angle with respect to the plane tangent to the vertical surfaces 141, 144 of the trench before the contact line can further advance and cause the liquid underfill material to overflow the edges 142, 145 into the trench. Second, if an edge of the trench 140 is unable to confine the underfill material as discussed above, the trench can serve as a containment reservoir that can receive and contain underfill material that flows over one or both of the edges 142, 145 of the trench. Such overflow of the underfill material 130b is shown at 131 in the trench portion 140c in FIG. 1A. Thus, the trench 140 can prevent underfill material from flowing to an unwanted area of the substrate 110, such as beyond an underfill KOZ about an electronic component.

A trench in accordance with the present disclosure can be dimensioned to accomplish this objective. For example, with reference to FIG. 2, an edge angle 150 between the top surface 113a and the vertical surface 141 can be from about 45 degrees to about 150 degrees (e.g., from about 90 degrees to about 150 degrees in some embodiments). The edge angle 150 can be configured to serve as a barrier to flowing liquid based on the substrate material (e.g., wetting properties), the underfill material (e.g., viscosity), the capabilities of the manufacturing process used to form the trench, etc. In one aspect, a width 151 of the trench can be configured to facilitate the barrier performing function of the edge and/or to facilitate the capture and containment of overflowing underfill material by providing sufficient trench volume. For example, the width 151 of the trench can be from about 65 µm to about 180 µm, although there need not be an upper limit to the width 151. In some embodiments, the width 151 of the trench can vary along its depth 152, such as when the vertical surfaces 141, 144 are non-parallel. In another aspect, like the width dimension 151, the depth 152 of the trench can be configured to facilitate the barrier performing function of the edge and/or to facilitate the capture and containment of overflowing underfill material by providing sufficient trench volume. The depth 152 may be the distance separating the horizontal surface 143 (e.g., the bottom of the trench) from the top surfaces 113a, 113b. The distance 152 can be from about 3 µm to about 180 µm, although there need not be an upper limit to the distance 152. In certain embodiments, the depth or distance 152 can be limited by a structure in the substrate 110, such as a conductive ground plane (not shown).

With further reference to FIGS. 1A and 1B, a lateral portion of underfill material (i.e., an underfill "tongue") can extend from an electronic component to at least an edge of a trench formed in a substrate. For example, a lateral portion 132a of the underfill material 130a extends from the electronic component 120 (e.g., from a lateral side 122a of the electronic component 120) to an edge of the trench portion 140a and terminates at the edge. In particular, the lateral portion 132a of the underfill material 130a includes a meniscus surface 134a extending between the electronic component 120 (e.g., from the lateral side 122a) and the top surface 113a of the substrate 110 at the edge of the trench portion 140a. Thus, the trench portion 140a is free or devoid of the underfill material 130a. Similarly, a lateral portion 132b of the underfill material 130a extends from the electronic component 120 (e.g., from a lateral side 122b of the electronic component 120) to an edge of the trench portion 140b and terminates at the edge. In particular, the lateral portion 132b of the underfill material 130a includes a meniscus surface 134b extending between the electronic component 120 (e.g., from the lateral side 122b) and the top surface 113a of the substrate 110 at the edge of the trench portion 140b. A lateral portion 133a of the underfill material 130b extends from the electronic component 121 (e.g., from a lateral side 123a of the electronic component 121) to an edge of the trench portion 140b and terminates at the edge. In particular, the lateral portion 133a of the underfill material 130b includes a meniscus surface 135a extending between the electronic component 120 (e.g., from the lateral side 123a) and the top surface 113b of the substrate 110 at the edge of the trench portion 140b. Thus, the trench portion 140b is free or devoid of the underfill materials 130a, 130b. A lateral portion 133b of the underfill material 130b extends from the electronic component 121 (e.g., from a lateral side 123b of the electronic component 121) beyond an edge of the trench portion 140c and onto a vertical surface or sidewall of the trench. In other words, as mentioned above, the underfill material 130b has flowed over the edge of the trench portion 140c and into the trench, as indicated at 131. Thus, the portion 131 of the underfill material 130b is disposed in the trench. In this case, the lateral portion 133b of the underfill material 130b includes a meniscus surface 135b extending from the electronic component 120 (e.g., from the lateral side 123b) that may or may not contact the top surface 113b of the substrate 110 at the edge of the trench portion 140c.

Figure 3:
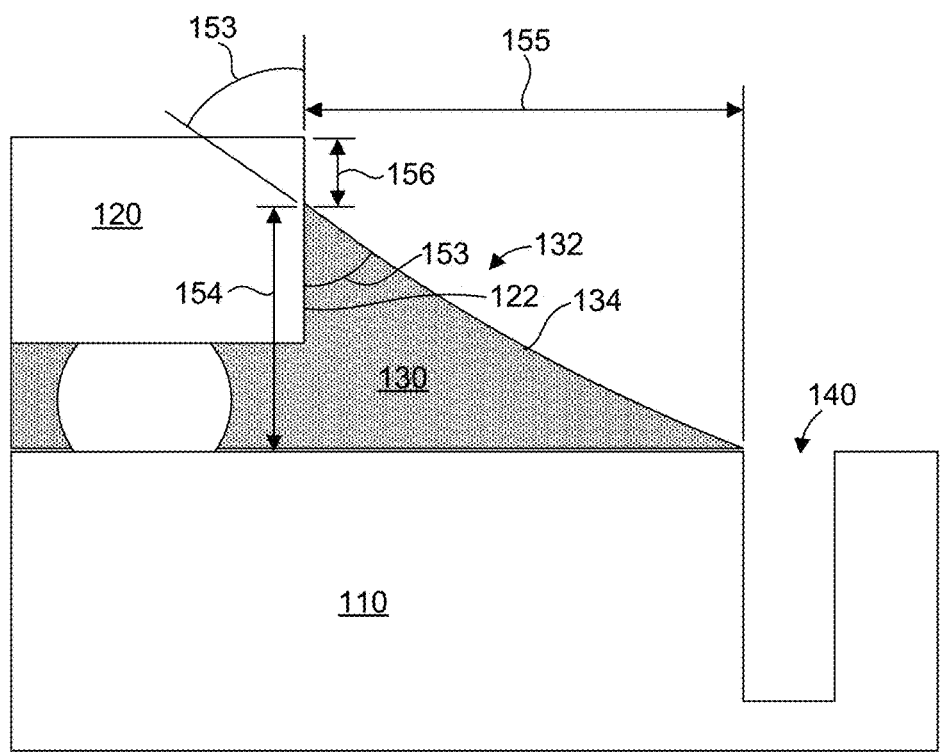
FIG. 3 illustrates a detailed side cross-sectional view of an electronic device package showing aspects of underfill geometry.

In one aspect, the underfill geometry (e.g., of the underfill tongue) can be controlled by the trench 140 as shown in FIG. 3, which generically illustrates a substrate 110, electronic component 120, and underfill material 130. For example, the location of the trench 140 relative to the electronic component 120 can control an angle 153 of a meniscus surface 134 of a lateral portion 132 of the underfill material 130 relative to a lateral surface 122 of the electronic component 120. The angle 153 may be the contact angle of the underfill material 130 with the lateral surface 122 of the electronic component 120, which can be vertical in some embodiments. In addition, the location of the trench 140 relative to the electronic component 120 can control a height 154 and/or a length 155 of the lateral portion 132 (i.e., underfill tongue) of the underfill material 130. In general, for a constant volume of underfill material 130, locating the trench 140 closer to the electronic component 120 will decrease the angle 153, increase the height 154, and decrease the length 155. The volume of the underfill material 130 can be adjusted accordingly to achieve a desired underfill geometry as well as a desired offset distance 156 of the underfill material from the top of the electronic component 120. Utilizing the trench 140 strategically about the electronic component 120 can enable a smaller angle 153 and shorter length 155 while maintaining a desired vertical offset distance 156 than is possible without confining underfill material flow, therefore providing more precise, accurate, and tighter underfill (e.g., underfill tongue control). This can be advantageous, for example, in reducing the likelihood of delamination of the underfill material from the lateral surface 122 of the electronic component 120, which is reduced as the angle 153 is reduced.

In some embodiments, the angle 153 can be from about 10 degrees to about 45 degrees. A ratio of the height 154 to the length 155 can be from about 1:1 to about 1:4. The height 154 can be from about 50 μm to about 200 μm. The length 155 can be from about 100 μm to about 800 μm. Note that the shapes of the meniscus surfaces shown in the figures are merely intended for illustration purposes, as an actual meniscus surface may have a different appearance (e.g., curvature) to those shown in the figures.

The benefits of finely controlling underfill geometry and KOZ can be particularly useful with respect to underfill for thin dies that continue to decrease in thickness as technology advances. As an example, for a 50 μm thick die and a targeted angle 153 of 30 degrees (e.g., for minimizing likelihood of delamination), it is desirable to achieve a KOZ distance (i.e., a length 155) of about 30 μm, which may require a KOZ solution with a placement accuracy of less than 10 μm to be effective.

FIGS. 1A and 1B illustrate an embodiment where the electronic components 120, 121 are separated by a common trench 140 (i.e., by the trench portion 140b). In some embodiments, the underfill materials 130a, 130b are the same. In other embodiments, utilizing the trench 140 between the electronic components 120, 121 can facilitate the use of different underfill materials 130a, 130b between the electronic components, which are mounted on the same substrate 110. This trench configuration can minimize space between adjacent components particularly when utilizing different underfill materials. Thus, the trench 140 can be used to inhibit or block the flow or spread of underfill material associated with multiple electronic components.

Figure 4A:
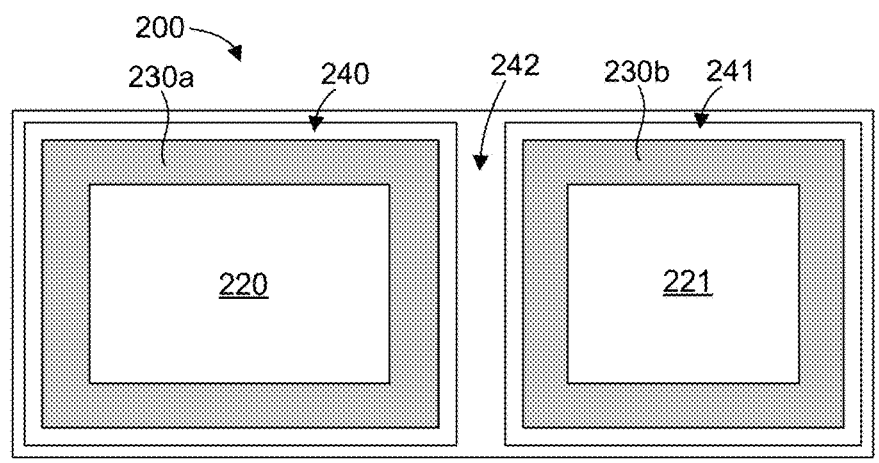
FIG. 4A illustrates a schematic representation of a top view of an electronic device package in accordance with an example embodiment.

FIG. 4A shows an embodiment of an electronic device package 200 where electronic components 220, 221 are separated by different trenches 240, 241. This embodiment can establish or define a region or zone 242 between the electronic components 220, 221 that is free of underfill material (e.g., underfill materials 230a, 230b). As with the electronic device package 100 of FIGS. 1A and 1B, the underfill materials 230a, 230b can be the same or different.

Figure 4B:
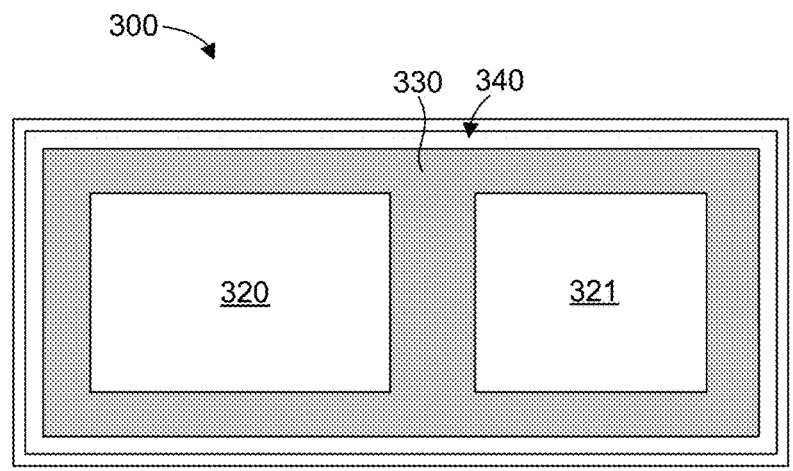
FIG. 4B illustrates a schematic representation of a top view of an electronic device package in accordance with an example embodiment.

FIG. 4B shows an embodiment of an electronic device package 300 where electronic components 320, 321 are not separated by a trench but, instead, are surrounded by the same trench 340. In this embodiment, the same underfill material 330 can be used for both electronic components 320, 321. This trench configuration can minimize space between adjacent components when utilizing the same underfill material. Thus, the trench 340 can be used to inhibit or block the flow or spread of underfill material associated with multiple electronic components.

Figure 4C:
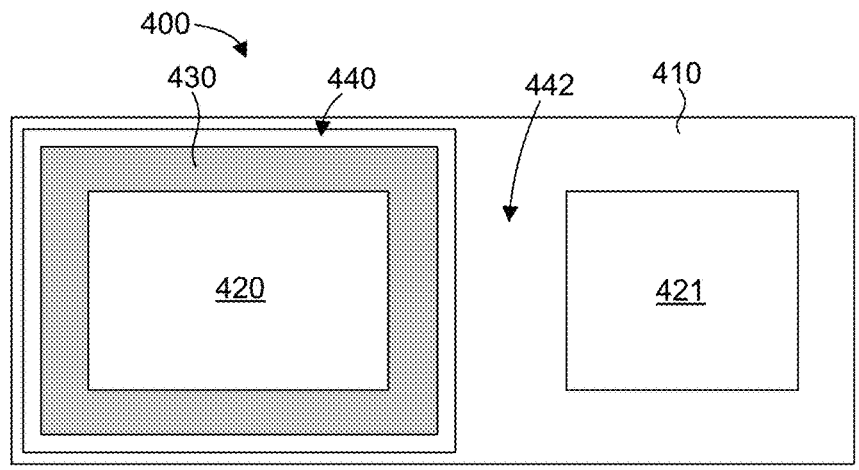
FIG. 4C illustrates a schematic representation of a top view of an electronic device package in accordance with an example embodiment.

Like the electronic device package 100 of FIGS. 1A and 1B, FIG. 4C also shows an embodiment of an electronic device package 400 where electronic components 420, 421 are separated by a common trench 440. In this case, however, the electronic component 421 is not surrounded by a trench and does not include underfill material. Utilizing the trench 440 only about a selected electronic component 420 can facilitate the use of underfill material 430 for only a certain electronic component 420 while leaving another electronic component mounted on the same substrate 410 free of underfill material. This embodiment can also establish or at least partially define a region or zone 442 between the electronic components 420, 421 that is free of underfill material.

Figure 5A:
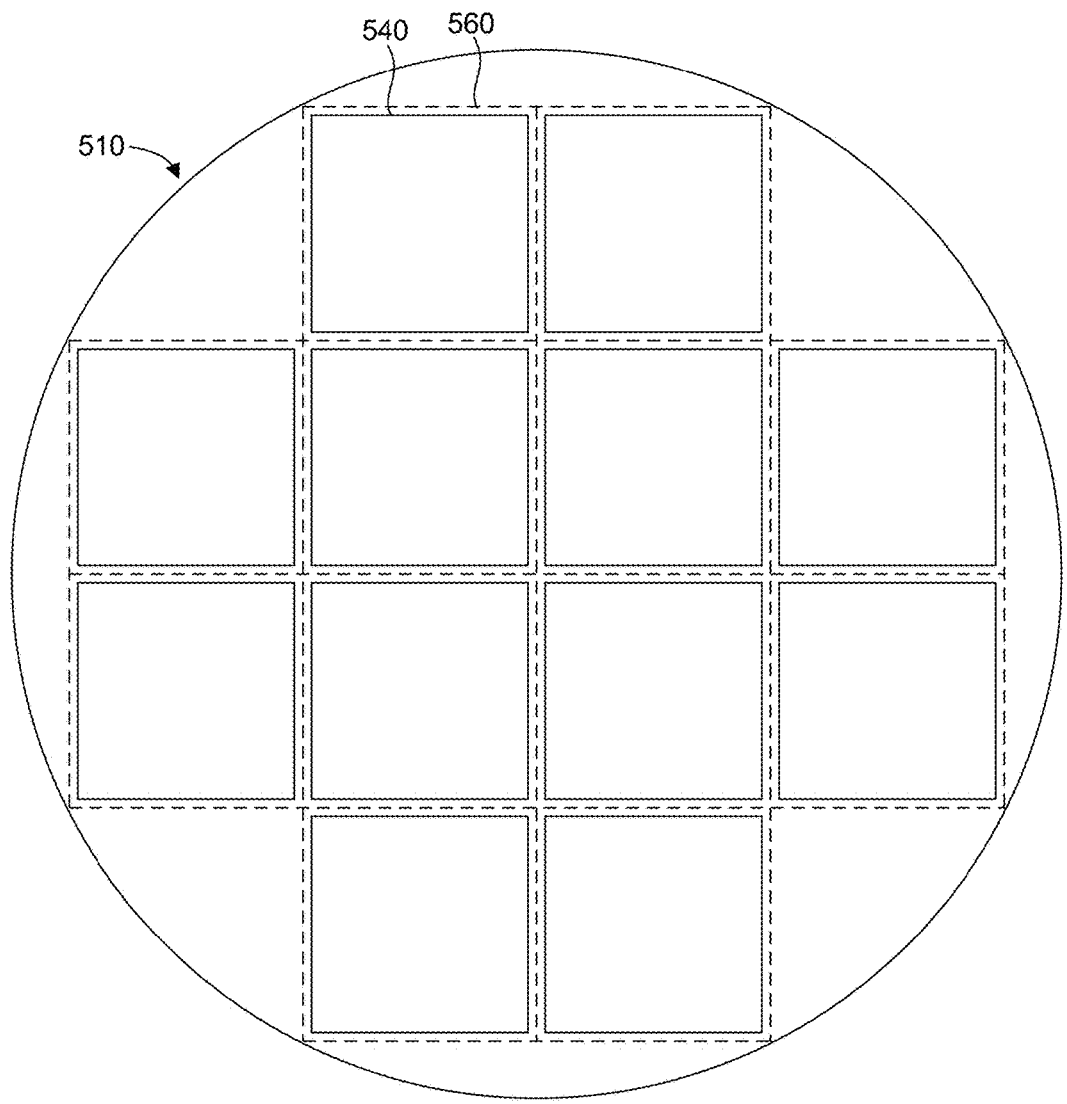
FIGS. 5A-5C illustrate aspects of a method for making an electronic device package, in accordance with an example embodiment.
Figure 5B:
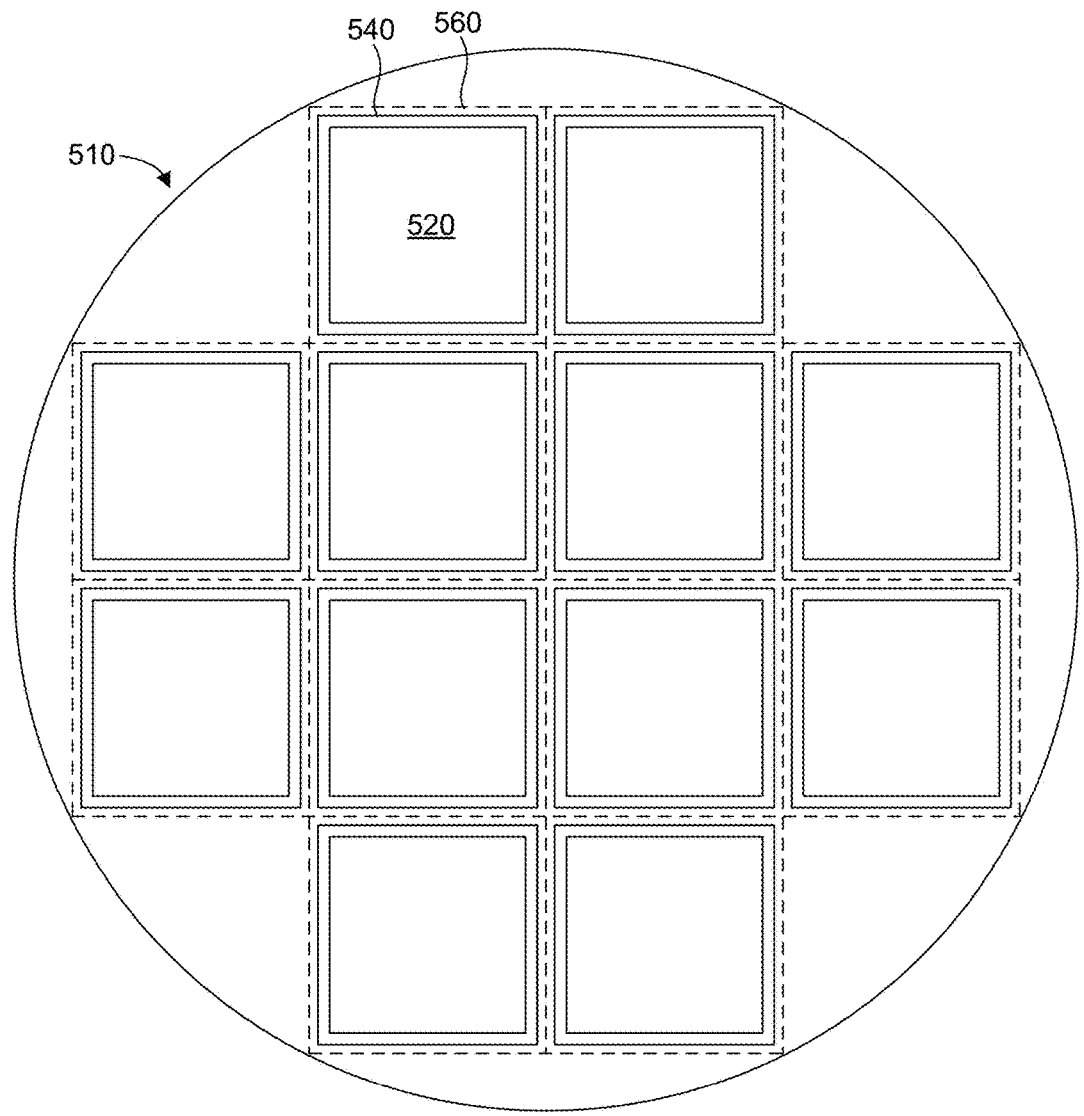
Figure 5C:
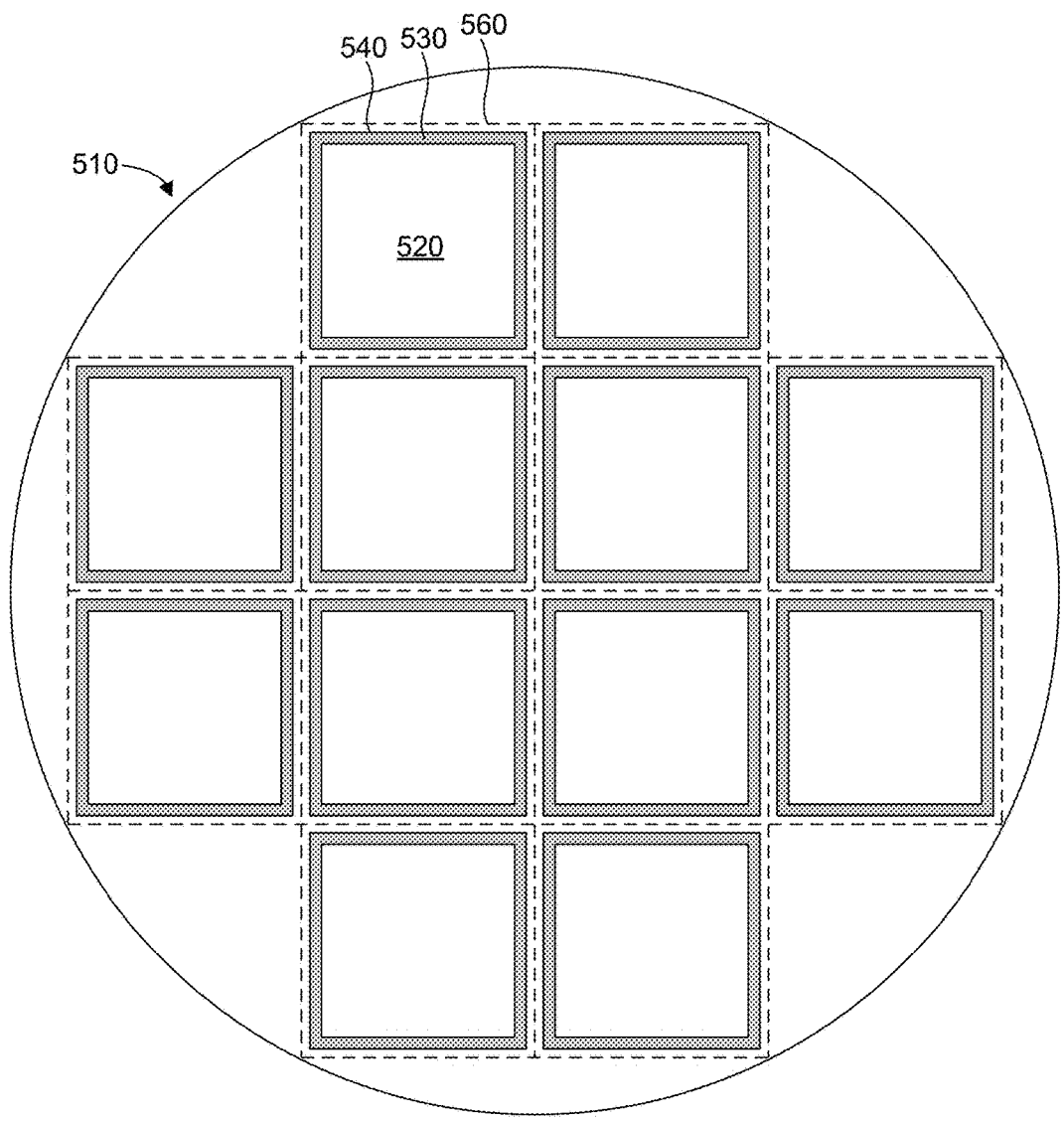

FIGS. 5A-5C illustrate aspects of exemplary methods or processes for making an electronic device package, such as any embodiment of an electronic device package disclosed herein. As an initial step, a substrate 510 can be obtained that is, or will be at a later processing step, configured to receive and couple with an electronic component. In this case, the substrate 510 is configured as a wafer 560. FIGS. 5A-5C show a top or plan view of the wafer substrate 510. In some embodiments, the wafer substrate can be configured to provide substrates configured as interposers, which may be primarily constructed of silicon. The substrate 510 can include electrically conductive terminals (not shown), such as an array of pads or lands that are arranged to mate with a corresponding array of terminals formed on an electronic component (e.g., to be flip-chip mounted on the substrate 510). Conductive terminals may comprise copper (or a copper alloy or other metal) pads. It should be understood that the disclosed embodiments are not limited to substrates adapted for flip-chip bonding and, further, that electrically conductive terminals may comprise any type of terminal or element that may be used to form an electrical connection with an electronic component (e.g., bond pads for wire bonding, etc.).

As shown in FIG. 5A, one or more trenches 540 can be formed in the substrate 510 extending downward relative to a top surface of the substrate 510. A trench 540 can be formed in the substrate 510 by any suitable process or technique, such as laser ablation (e.g., UV laser, pulse laser, laser raster skiving, projection patterning, etc.), lithography, etching, etc. Ablation of silicon using pulsed laser by skiving mode is a very flexible process, which can vary the width and length of a trench by controlling the travel of the laser beam during the raster scan. The number of raster scans during a skiving process can determine the depth of trench. The width of the trench depends on the size of beam and accuracy of galvano mirrors. Thus, the construction of a laser tool can be adapted to efficiently conduct the trench ablation process in high volume manufacturing.

The trenches 540 can be configured to define one or more underfill confinement boundaries (e.g., underfill KOZ) as described herein. For example, a trench 540 can be formed on a surface of the substrate 510 about at least a portion of a region configured to receive an electronic component.

Such a trench 540 can control the flow and spread of an underfill material and, hence, inhibit the flow of the underfill material and thereby establish or maintain an underfill KOZ on the substrate surface. By confining underfill flow, the size and boundaries of the KOZ can be minimized and maintained, which may be beneficial for small form factor packages. A trench 540 can be arranged in a pattern that at least partially defines a KOZ or that otherwise inhibits or prevents the flow or spread of underfill material beyond the KOZ. For example, as shown in FIG. 5A, the trench 540 may be arranged in a pattern that is configured to fully surround (or at least substantially surround) a perimeter of an electronic component. In another example, a trench can be arranged to be about fewer than all sides of an electronic component, such as in a single line along one side of an electronic component, to at least partially define a KOZ. It should be understood that a trench may be arranged in any desired pattern or configuration, and the pattern that is used may be a function of several factors (e.g., the package form factor, die size, underfill viscosity, the process flow, etc.). In addition, a trench can be formed to have any suitable dimension (e.g., width, depth, edge angle, etc.). In the case of the substrate 510, the underfill confinement boundaries can be configured, at least in part, to establish keep out zones about electronic components that maintains sufficient separation between adjacent components to facilitate singulation. Thus, the establishment of underfill keep out zones can enable closer placement of electronic components on the wafer substrate 510 and therefore improve the yield or output per wafer. Singulation locations are shown on the wafer substrate 510 as broken lines 560 in FIGS. 5A-5C. As a result, the singulated substrate portions can be smaller, which can reduce the footprint of electronic device packages made with the substrate portions.

As shown in FIG. 5B, one or more electronic components 520 can be disposed on the substrate 510 (e.g., on a top surface of the substrate 510), such that the electronic component 520 is electrically coupled to the substrate 510 (e.g., through solder bumps). It should be recognized that the trench 540 can be formed prior to or after an electronic component has been disposed on the substrate 510. For example, FIG. 5A illustrates the trench 540 formed in the substrate 510 without an electronic component, and FIG. 5B illustrates the trench 540 in the substrate 510 with an electronic component 520 that may have been disposed on the substrate 510 before or after the formation of the trench 540. Accordingly, in one aspect, FIG. 5A illustrates an electronic device package precursor, which includes a substrate having a top surface configured to receive an electronic component, and a trench extending downward relative to the top surface that defines an underfill confinement boundary. In another aspect, FIG. 5B illustrates an electronic device package precursor that further includes an electronic component disposed on the top surface of the substrate and electrically coupled to the substrate (e.g., through solder bumps). Each of these electronic device package precursors can be subjected to further processing to create an electronic device package in accordance with the present disclosure as described below.

For example, as shown in FIG. 5C, underfill material 530 can be disposed at least partially between the electronic component 520 and the substrate 510 (e.g., the top surface of the substrate 510). The underfill material 530 can be disposed between the electronic component 520 and the substrate 510 utilizing any suitable process or technique, such as dispensing. Typically, the underfill material 530 would be dispensed onto the substrate 510 in a region between the trench 540 and a lateral side of the electronic component 520. The underfill material 530 may flow between the electronic component 520 and the substrate 510 using capillary action and can be confined about the electronic component 520 by the trench 540. The underfill materials utilized for the various electronic components on the wafer substrate 510 can be the same or different.

The underfill material 530 can form a mechanical bond between the electronic component 520 and the substrate 510, and may also provide support to, and increase the strength of, the electrical connection formed by solder bumps attaching the electronic component to the substrate. The underfill material 530 may comprise any material capable of performing one or more of the above-described as well as other functions. In one embodiment, the underfill material 530 comprises an epoxy, such as a polymer epoxy. When formed from an epoxy material, the underfill material 530 is then typically cured to harden the polymer.

As shown in FIG. 5C, the trench 540 inhibits or restricts the flow of the underfill material 530. For example, in the illustrated embodiment, the underfill material 530 can flow or spread across the substrate 510 surface up to the trench 540, but the trench 540 inhibits the continued outward flow and confines the underfill material 530. In one aspect, the trench 540 can be configured such that the underfill material 530 does not cross over or flow beyond the trench 540.

The trench 540 may be positioned to permit whatever amount of spreading of the underfill material 530 is desired. For example, in certain applications, it may be useful to have the underfill material 530 spread a small, uniform distance outward from the electronic component, for protection. In other applications, it may be useful to minimize underfill spread beyond the electronic component, or to provide for different amounts of underfill spread on different sides of the electronic component. By controlling or limiting the extent of the flow of the underfill material 530 using the trench 540, the size and boundary of the underfill KOZ can be minimized and/or maintained.

It should be appreciated that the exact position and shape of the trench 540 may be varied from that shown in the figures. Depending on factors including, for example, the size of the substrate and the presence of other structures on the substrate, the underfill KOZ can be configured to any desired shape and any desired size outside of the electronic component, by controlling the location and shape of the trench 540 formed about the electronic component. In one embodiment, the trench may be formed along one side, two sides, three sides, or four sides of the electronic component. In some cases, the trench may form an open perimeter and in other cases the trench may form a closed perimeter. In an additional embodiment, the trench can take any shape required in order to achieve a specific result, such as rectangular, square, circular, oval, pentagonal, hexagonal, octagonal, or the like. The trench can also be formed to any depth, width, or have any edge angle desired. It should also be appreciated that the electronic component may have multiple configurations, for example, more or less than four sides.

In one aspect, FIG. 5C also illustrates an electronic device package precursor, which in this case further includes the underfill material 530 disposed at least partially between the electronic component 520 and the substrate 510 (e.g., extending from the electronic component to the trench). In a particular aspect, the underfill material 530 can be in a liquid state.

Although FIGS. 5A-5C illustrate various aspects of the method for making an electronic device package in the context of wafer level processing, it should be recognized that aspects of the method can be performed at an individual die or package level following singulation of a wafer into individual components.

Following singulation of the substrate wafer 510, the resulting edges and lateral sides of the singulated substrate portions can have a variety of configurations. For example, due to the proximity of the trenches 540 to the singulation lines 560, the trenches 540 may or may not be affected by the singulation process. The embodiments in FIGS. 1A-1B, and 4A-4C illustrate trenches that at least partially border lateral sides of the respective substrates. These trenches can represent examples of trenches that are preserved during singulation and remain unaffected by the singulation process.

Figure 6A:
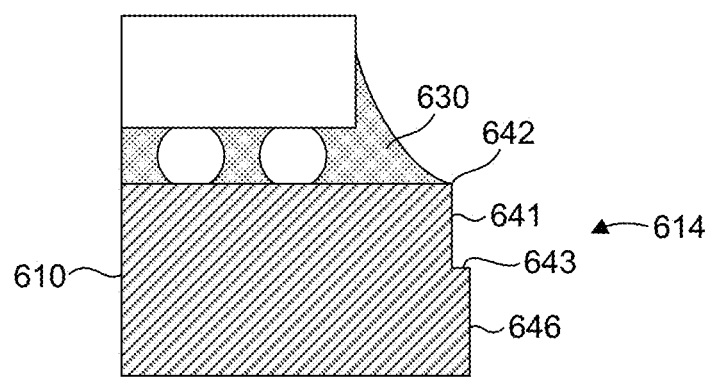
FIGS. 6A-6C illustrate substrate lateral surface configurations following singulation in accordance with several example embodiments.

FIG. 6A, on the other hand, illustrates a lateral side 614 of a substrate 610 with a trench that has been affected by the singulation process, with part of the trench preserved during singulation. In this case, the singulation process removed part of the trench, leaving only a vertical surface or sidewall 641 and at least part of a horizontal surface 643. The result is the formation of a new vertical surface 646 extending downward from the horizontal surface 643 that defines an outer boundary of the substrate 610, with the vertical surface 641 and the horizontal surface 643 being exposed and forming outer surfaces of the substrate 610. Because the vertical surface 641 has been preserved, the singulation process did not affect the edge 642 of the trench or the underfill material 630 extending to the edge 642. In this embodiment, the underfill material 639 still terminates at the edge 642, although in other embodiments, underfill may overflow the edge 642 and be present to some extent on the vertical surface 641 and, in some cases, on the horizontal surface 643.

Figure 6B:
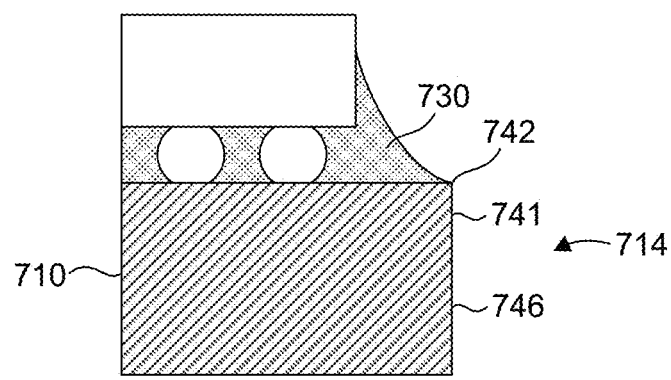

The embodiment shown in FIG. 6B is similar to the embodiment shown in FIG. 6A except that the singulation process has completely removed the horizontal or bottom surface of the trench on a lateral side 714 of a substrate 710. The result is the preservation of a vertical surface 741 of the trench and the formation of a new vertical surface 746 extending downward from the vertical surface 741 that is substantially coplanar with the vertical surface 741. The vertical surface 741 and the vertical surface 746 form outer surfaces of the substrate 710. Because the vertical surface 741 has been preserved, the singulation process did not affect an edge 742 of the trench or the underfill material 730 extending to the edge 742.

Figure 6C:
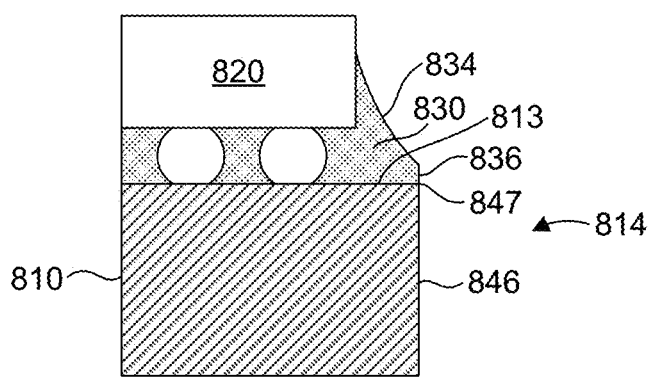

In the embodiment shown in FIG. 6C, the singulation process has completely removed the features of the trench on a lateral side 814 of a substrate 810. The result is the formation of a new vertical surface 846 that extends the entire thickness of the substrate 810 and intersects with a top surface 813 of the substrate 810 to form a new edge 847 of the substrate 810. In addition, a lateral portion of underfill material 830 now includes an underfill vertical surface 836 extending upward from the edge 847 and parallel to the vertical surface 846 of the substrate 810. A meniscus surface 834 of the underfill material 830 now extends between an electronic component 820 and the underfill vertical surface 836. Thus, the lateral portion of the underfill material 830 extends to the edge 847 and terminates at the edge 847. The vertical surface 846 forms the outer surface of the substrate 810, and the vertical surfaces 846, 836 form the outer boundary of the electronic device package.

Figure 7:
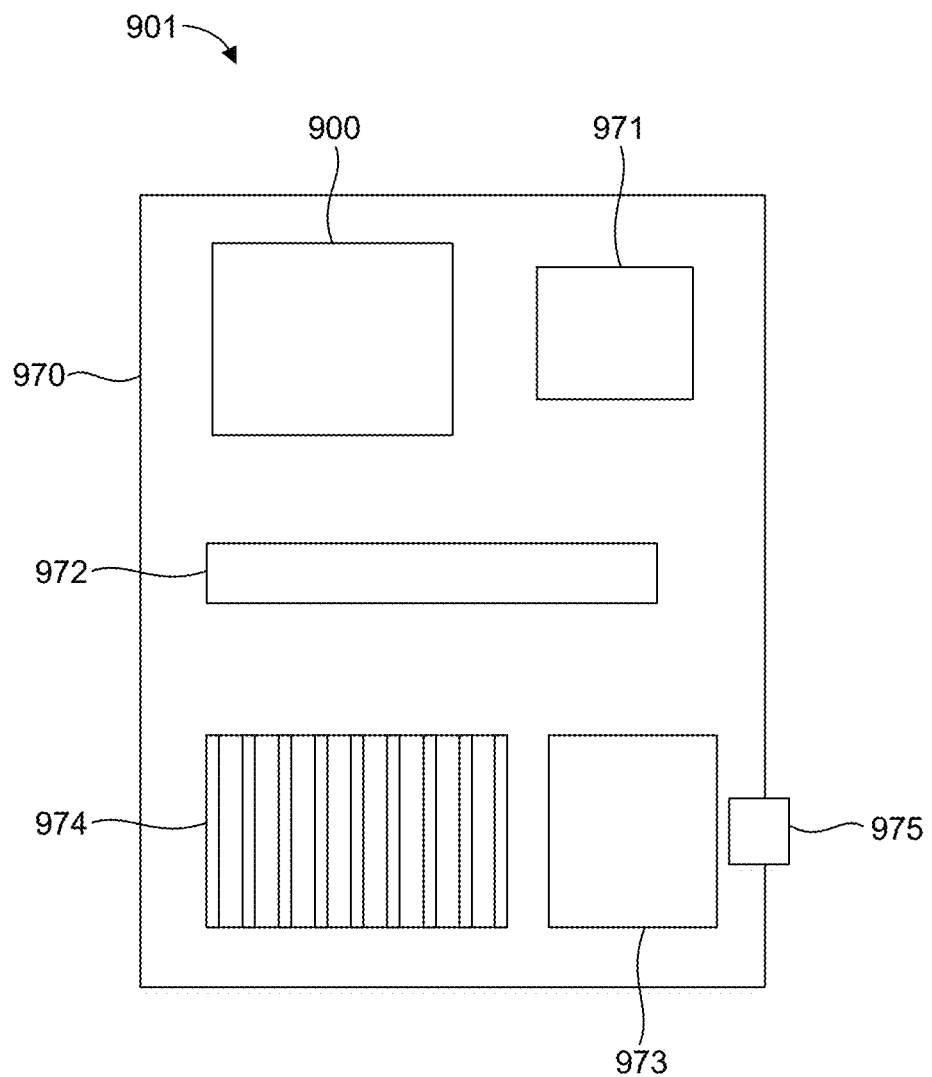
FIG. 7 is a schematic illustration of an exemplary computing system.

FIG. 7 illustrates an example computing system 901. The computing system 901 can include an electronic device package 900 as disclosed herein, coupled to a motherboard 970. In one aspect, the computing system 901 can also include a processor 971, a memory device 972, a radio 973, a heat sink 974, a port 975, a slot, or any other suitable device or component, which can be operably coupled to the motherboard 970. The computing system 901 can comprise any type of computing system, such as a desktop computer, a laptop computer, a tablet computer, a smartphone, a wearable device, a server, etc. Other embodiments need not include all of the features specified in FIG. 7, and may include alternative features not specified in FIG. 7.

Examples

The following examples pertain to further embodiments.

In one example, there is provided an electronic device package comprising a substrate having a top surface and a vertical surface extending downward from the top surface, the top surface and the vertical surface defining an edge, an electronic component disposed on the top surface of the substrate and electrically coupled to the substrate, and an underfill material disposed at least partially between the electronic component and the top surface of the substrate, wherein a lateral portion of the underfill material extends from the electronic component to at least the edge.

In one example of an electronic device package, the lateral portion of the underfill material extends to the edge and terminates at the edge.

In one example of an electronic device package, the lateral portion of the underfill material includes a meniscus surface extending between the electronic component and the top surface at the edge.

In one example of an electronic device package, an angle of the meniscus surface relative to a lateral surface of the electronic component is from about 10 degrees to about 45 degrees.

In one example of an electronic device package, a ratio of a height to a length of the lateral portion of the underfill material is from about 1:1 to about 1:4.

In one example of an electronic device package, the lateral portion of the underfill material includes an underfill vertical surface extending upward from the edge and parallel to the vertical surface of the substrate, and a meniscus surface extending between the electronic component and the underfill vertical surface.

In one example of an electronic device package, an angle of the meniscus surface relative to a lateral surface of the electronic component is from about 10 degrees to about 45 degrees.

In one example of an electronic device package, the lateral portion of the underfill material extends beyond the edge and onto the vertical surface.

In one example of an electronic device package, an angle between the top surface and the vertical surface is from about 90 degrees to about 150 degrees.

In one example of an electronic device package, the substrate further comprises a horizontal surface extending from the vertical surface.

In one example of an electronic device package, the horizontal surface is separated from the top surface by a distance of from about 3 μm to about 180 μm.

In one example of an electronic device package, the substrate further comprises a second vertical surface extending from the horizontal surface.

In one example of an electronic device package, the second vertical surface extends downward from the horizontal surface and defines an outer boundary of the substrate.

In one example of an electronic device package, the second vertical surface extends upward from the horizontal surface and, along with the first vertical surface and the horizontal surface, defines a trench in the substrate.

In one example of an electronic device package, a width of the trench is from about 65 μm to about 180 μm.

In one example, an electronic device package comprises a second electronic component disposed on the substrate and electrically coupled to the substrate.

In one example of an electronic device package, the second electronic component is disposed on the top surface of the substrate.

In one example of an electronic device package, the underfill material is disposed at least partially between the second electronic component and the top surface of the substrate.

In one example of an electronic device package, the substrate further comprises a second top surface, and a trench between the first and second top surfaces, and wherein the second electronic component is disposed on the second top surface of the substrate.

In one example, an electronic device package comprises a second underfill material disposed at least partially between the second electronic component and the second top surface of the substrate.

In one example of an electronic device package, a second lateral portion of the second underfill material extends from the second electronic component to the trench.

In one example of an electronic device package, the substrate further comprises a second trench between the first and second top surfaces, wherein a second lateral portion of the second underfill material extends from the second electronic component to the second trench.

In one example of an electronic device package, the trench is free of the first and second underfill materials.

In one example of an electronic device package, a portion of at least one of the first underfill material and the second underfill material is disposed in the trench.

In one example of an electronic device package, the first and second underfill materials are the same material.

In one example of an electronic device package, the first and second underfill materials are different materials.

In one example of an electronic device package, the underfill material comprises an epoxy.

In one example of an electronic device package, the electronic component comprises a semiconductor device.

In one example of an electronic device package, the electronic component is coupled to the substrate through a plurality of solder bumps.

In one example of an electronic device package, the substrate comprises silicon, AJINOMOTO BUILD-UP FILM® (ABF), copper, or a combination thereof.

In one example of an electronic device package, the substrate is configured as an interposer.

In one example, there is provided an electronic device package precursor comprising a substrate having a top surface configured to receive an electronic component, and a trench extending downward relative to the top surface that defines an underfill confinement boundary.

In one example of an electronic device package precursor, the trench is configured to extend about a perimeter of the electronic component.

In one example, an electronic device package precursor comprises the electronic component disposed on the top surface of the substrate and electrically coupled to the substrate.

In one example, an electronic device package precursor comprises underfill material disposed at least partially between the electronic component and the top surface of the substrate, wherein a lateral portion of the underfill material extends from the electronic component to the trench.

In one example of an electronic device package precursor, the lateral portion of the underfill material includes a meniscus surface extending between the electronic component and the top surface at the trench.

In one example of an electronic device package precursor, an angle of the meniscus surface relative to a lateral surface of the electronic component is from about 10 degrees to about 45 degrees.

In one example of an electronic device package precursor, a ratio of a height to a length of the lateral portion of the underfill material is from about 1:1 to about 1:4.

In one example of an electronic device package precursor, the trench is free of the underfill material.

In one example of an electronic device package precursor, a portion of the underfill material is disposed in the trench.

In one example of an electronic device package precursor, the underfill material is in a liquid state.

In one example of an electronic device package precursor, the underfill material comprises an epoxy.

In one example, an electronic device package precursor comprises a second electronic component disposed on the substrate and electrically coupled to the substrate.

In one example of an electronic device package precursor, the second electronic component is disposed on the top surface of the substrate.

In one example, an electronic device package precursor comprises underfill material disposed at least partially between the first electronic component and the top surface of the substrate, wherein a lateral portion of the underfill material extends from the electronic component to the trench.

In one example of an electronic device package precursor, the underfill material is disposed at least partially between the second electronic component and the top surface of the substrate.

In one example of an electronic device package precursor, the substrate further comprises a second top surface, the trench being between the first and second top surfaces of the substrate, and wherein the second electronic component is disposed on the second top surface of the substrate.

In one example, an electronic device package precursor comprises an underfill material disposed at least partially between the first electronic component and the first top surface of the substrate, wherein a lateral portion of the underfill material extends from the first electronic component to the trench.

In one example, an electronic device package precursor comprises a second underfill material disposed at least partially between the second electronic component and the second top surface of the substrate.

In one example of an electronic device package precursor, a second lateral portion of the second underfill material extends from the second electronic component to the trench.

In one example, an electronic device package precursor comprises a second trench between the first and second top surfaces of the substrate, wherein a second lateral portion of the second underfill material extends from the second electronic component to the second trench.

In one example of an electronic device package precursor, the trench is free of the first and second underfill materials.

In one example of an electronic device package precursor, a portion of at least one of the first underfill material and the second underfill material is disposed in the trench.

In one example of an electronic device package precursor, the first and second underfill materials are the same material.

In one example of an electronic device package precursor, the first and second underfill materials are different materials.

In one example of an electronic device package precursor, the trench is at least partially defined by a vertical surface that extends downward from the top surface, and an angle between the top surface and the vertical surface is from about 90 degrees to about 150 degrees.

In one example of an electronic device package precursor, a depth of the trench is from about 3 µm to about 180 µm.

In one example of an electronic device package precursor, a width of the trench is from about 65 µm to about 180 µm.

In one example of an electronic device package precursor, the substrate is in a wafer configuration.

In one example of an electronic device package precursor, the substrate comprises silicon, AJINOMOTO BUILD-UP FILM® (ABF), copper, or a combination thereof.

In one example of an electronic device package precursor, the substrate is configured as an interposer.

In one example, there is provided a computing system comprising a motherboard, and an electronic device package operably coupled to the motherboard. The electronic device package comprises a substrate having a top surface and a vertical surface extending downward from the top surface, the top surface and the vertical surface defining an edge, an electronic component disposed on the top surface of the substrate and electrically coupled to the substrate, and an underfill material disposed at least partially between the electronic component and the top surface of the substrate, wherein a lateral portion of the underfill material extends from the electronic component to at least the edge.

In one example of a computing system, the computing system comprises a desktop computer, a laptop, a tablet, a smartphone, a wearable device, a server, or a combination thereof.

In one example of a computing system, the computing system further comprises a processor, a memory device, a heat sink, a radio, a slot, a port, or a combination thereof operably coupled to the motherboard.

In one example, there is provided a method for making an electronic device package comprising obtaining a substrate for receiving and coupling with an electronic component, and forming a trench in a top surface of the substrate extending downward relative to the top surface, wherein the trench is configured to define an underfill confinement boundary.

In one example of a method for making an electronic device package, forming the trench comprises laser ablation, lithography, etching, or a combination thereof.

In one example of a method for making an electronic device package, the trench is configured to extend about a perimeter of the electronic component.

In one example, a method for making an electronic device package comprises disposing the electronic component on the top surface of the substrate, such that the electronic component is electrically coupled to the substrate.

In one example, a method for making an electronic device package comprises disposing an underfill material at least partially between the electronic component and the top surface of the substrate, wherein a lateral portion of the underfill material is confined by the trench.

In one example of a method for making an electronic device package, the lateral portion of the underfill material includes a meniscus surface extending between the electronic component and the top surface at the trench.

In one example of a method for making an electronic device package, an angle of the meniscus surface relative to a lateral surface of the electronic component is from about 10 degrees to about 45 degrees.

In one example of a method for making an electronic device package, a ratio of a height to a length of the lateral portion of the underfill material is from about 1:1 to about 1:4.

In one example of a method for making an electronic device package, the trench is free of the underfill material.

In one example of a method for making an electronic device package, a portion of the underfill material is disposed in the trench.

In one example of a method for making an electronic device package, the underfill material comprises an epoxy.

In one example, a method for making an electronic device package comprises disposing a second electronic component on the substrate, such that the second electronic component is electrically coupled to the substrate.

In one example of a method for making an electronic device package, the second electronic component is disposed on the top surface of the substrate.

In one example, a method for making an electronic device package comprises disposing an underfill material at least partially between the first and second electronic components and the top surface of the substrate, wherein the underfill material is confined by the trench.

In one example of a method for making an electronic device package, the substrate further comprises a second top surface, the trench being between the first and second top surfaces of the substrate, and wherein the second electronic component is disposed on the second top surface of the substrate.

In one example, a method for making an electronic device package comprises disposing an underfill material at least partially between the first electronic component and the first top surface of the substrate, wherein the underfill material is confined by the trench.

In one example, a method for making an electronic device package comprises disposing a second underfill material at least partially between the second electronic component and the second top surface of the substrate.

In one example of a method for making an electronic device package, the second underfill material is confined by the trench.

In one example, a method for making an electronic device package comprises a second trench between the first and second top surfaces of the substrate, wherein the second underfill material is confined by the second trench.

In one example of a method for making an electronic device package, the trench is free of the first and second underfill materials.

In one example of a method for making an electronic device package, a portion of at least one of the first underfill material and the second underfill material is disposed in the trench.

In one example of a method for making an electronic device package, the first and second underfill materials are the same material.

In one example of a method for making an electronic device package, the first and second underfill materials are different materials.

In one example of a method for making an electronic device package, the trench is at least partially defined by a vertical surface that extends downward from the top surface, and an angle between the top surface and the vertical surface is from about 90 degrees to about 150 degrees.

In one example of a method for making an electronic device package, a depth of the trench is from about 3 µm to about 180 µm.

In one example of a method for making an electronic device package, a width of the trench is from about 65 µm to about 180 µm.

In one example of a method for making an electronic device package, the substrate is in a wafer configuration.

In one example, a method for making an electronic device package comprises singulating the substrate.

In one example of a method for making an electronic device package, at least a portion of the trench is preserved during singulation.

In one example of a method for making an electronic device package, at least a portion of the trench is at least partially removed during singulation.

In one example of a method for making an electronic device package, the substrate comprises silicon, AJINOMOTO BUILD-UP FILM® (ABF), copper, or a combination thereof.

In one example of a method for making an electronic device package, the substrate is configured as an interposer.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. An electronic device package, comprising:
    a substrate having a top surface and a trench extending downward relative to the top surface, the top surface that defines an underfill confinement boundary, wherein a depth of the trench is from about 3 µm to about 180 µm;
    an electronic component disposed on the top surface of the substrate and electrically coupled to the substrate; and
    an underfill material disposed at least partially between the electronic component and the top surface of the substrate.

2. The electronic device package of claim 1, wherein a lateral portion of the underfill material includes a meniscus surface extending between the electronic component and an edge of the trench.

3. The electronic device package of claim 2, wherein the lateral portion of the underfill material includes an underfill vertical surface extending upward from the edge and parallel to a vertical surface of the trench, and a meniscus surface extending between the electronic component and the underfill vertical surface.

4. The electronic device package of claim 1, wherein an angle between the top surface and a vertical surface of the trench is from about 90 degrees to about 150 degrees.

5. The electronic device package of claim 1, further comprising a second electronic component disposed on the substrate and electrically coupled to the substrate.

6. The electronic device package of claim 1, wherein the underfill material comprises an epoxy.

7. The electronic device package of claim 1, wherein the electronic component comprises a semiconductor device.

8. The electronic device package of claim 1, wherein the electronic component is coupled to the substrate through a plurality of solder bumps.

9. The electronic device package of claim 1, wherein the substrate comprises silicon, AJINOMOTO BUILD-UP FILM® (ABF), copper, or a combination thereof.

10. The electronic device package of claim 1, wherein the substrate is configured as an interposer.

11. An electronic device package precursor, comprising:
    a substrate having a top surface configured to receive an electronic component, and a trench extending downward relative to the top surface that defines an underfill confinement boundary, wherein a depth of the trench is from about 3 µm to about 180 µm.

12. The electronic device package precursor of claim 11, wherein the trench is configured to extend about a perimeter of the electronic component.

13. The electronic device package precursor of claim 11, further comprising the electronic component disposed on the top surface of the substrate and electrically coupled to the substrate.

14. The electronic device package precursor of claim 11, wherein the trench is at least partially defined by a vertical surface that extends downward from the top surface, and an angle between the top surface and the vertical surface is from about 90 degrees to about 150 degrees.

15. The electronic device package precursor of claim 11, wherein a width of the trench is from about 65 µm to about 180 µm.

16. The electronic device package precursor of claim 11, wherein the substrate is in a wafer configuration.

17. The electronic device package precursor of claim 11, wherein the substrate comprises silicon, AJINOMOTO BUILD-UP FILM® (ABF), copper, or a combination thereof.

18. The electronic device package precursor of claim 11, wherein the substrate is configured as an interposer.

19. A method for making an electronic device package, comprising:
    obtaining a substrate for receiving and coupling with an electronic component; and forming a trench in a top surface of the substrate extending downward relative to the top surface, wherein the trench is configured to define an underfill confinement boundary, wherein a depth of the trench is from about 3 μm to about 180 μm.

20. The method of claim 19, wherein forming the trench comprises laser ablation, lithography, etching, or a combination thereof.

21. The method of claim 19, wherein the trench is configured to extend about a perimeter of the electronic component.

22. The method of claim 19, further comprising disposing the electronic component on the top surface of the substrate, such that the electronic component is electrically coupled to the substrate.

23. The method of claim 19, wherein a width of the trench is from about 65 μm to about 180 μm.

24. The method of claim 19, wherein the substrate is in a wafer configuration.

* * * * *